United States Patent
Lee et al.

(10) Patent No.: US 8,536,782 B2
(45) Date of Patent: Sep. 17, 2013

(54) BLUE LIGHT-EMITTING DEVICE AND ORGANIC LIGHT EMITTING DISPLAY INCLUDING THE SAME

(75) Inventors: Sung-Hun Lee, Yongin (KR); Jung-Bae Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 230 days.

(21) Appl. No.: 12/968,463

(22) Filed: Dec. 15, 2010

(65) Prior Publication Data

US 2011/0140597 A1  Jun. 16, 2011

(30) Foreign Application Priority Data

Dec. 16, 2009  (KR) .................. 10-2009-0125691

(51) Int. Cl.
*H01L 51/50* (2006.01)
(52) U.S. Cl.
USPC ......................................... 313/506
(58) Field of Classification Search
USPC .................................. 313/498–512
See application file for complete search history.

(56) References Cited

U.S. PATENT DOCUMENTS

| 7,102,282 | B1 | 9/2006 | Yamada et al. | |
| 2007/0063641 | A1* | 3/2007 | Cok et al. | 313/506 |
| 2007/0069641 | A1* | 3/2007 | Hasegawa et al. | 313/504 |
| 2008/0018239 | A1 | 1/2008 | Matsuda et al. | |
| 2008/0136318 | A1 | 6/2008 | Kashiwabara | |
| 2009/0296214 | A1* | 12/2009 | Sano et al. | 359/497 |

FOREIGN PATENT DOCUMENTS

| JP | 2006-302748 | 11/2006 |
| JP | 2008-27722 | 2/2008 |
| JP | 2008-34288 | 2/2008 |
| KR | 10-0908229 B1 | 7/2009 |

OTHER PUBLICATIONS

English translation of Application No. KR 10-2002-0076993 (for KR 10-908229).*
KIPO Office action dated Feb. 10, 2011, for Korean priority Patent application 10-2009-0125691.
Korean Patent Abstracts, Publication No. 1020040049144, dated Jun. 11, 2004, corresponding to Korean Patent 10-0908229.

* cited by examiner

*Primary Examiner* — Anh Mai
*Assistant Examiner* — Hana Featherly
(74) *Attorney, Agent, or Firm* — Christie, Parker & Hale, LLP

(57) ABSTRACT

A blue light-emitting device, and an organic light-emitting display including the blue light-emitting device, has a non-resonance structure including a blue light-emitting layer between a reflective electrode and a transparent electrode, and thus has an excellent process margin, an excellent luminance characteristic even in a wide optical viewing angle, and a high color reproduction satisfying an sRGB blue standard.

26 Claims, 4 Drawing Sheets

BLUE LIGHT-EMITTING DEVICE AND ORGANIC LIGHT EMITTING DISPLAY INCLUDING THE SAME

CROSS-REFERENCE TO RELATED APPLICATION

This application claims the benefit of Korean Patent Application No. 10-2009-0125691, filed Dec. 16, 2009 in the Korean Intellectual Property Office, the disclosure of which is incorporated herein by reference.

BACKGROUND

1. Field

Aspects of the present invention relate to a light-emitting device, and more particularly, to a blue light-emitting device having high color characteristics, and an organic light-emitting display including the blue light-emitting device.

2. Description of the Related Art

Generally, an organic light-emitting device (OLED) includes an anode, a cathode, and an organic light-emitting layer. The organic light-emitting layer has a functional thin film form and is disposed between the anode and the cathode. In the OLED, a hole and an electron are injected into the organic light-emitting layer respectively from the anode and the cathode where they combine to form an exciton, which emits light.

The OLED is classified into a passive matrix (PM) type using a passive driving method, and an active matrix (AM) type using an active driving method, according to a method of driving the OLED. In a PM type OLED (PM-OLED), anodes and cathodes are respectively arranged in columns and rows, and a scanning signal is supplied to the cathodes from a row driving circuit to select one of the rows. Also, a column driving circuit inputs a data signal to each pixel. In an AM type OLED (AM-OLED), a signal input to each pixel is controlled by using a thin-film transistor (TFT). The AM-OLED is suitable for processing a large number of signals, and thus is mostly used as a display for realizing a moving image.

A red, green, and blue (RGB) independent deposition method using a fine metal mask (FMM) is mostly used to obtain a full color OLED that is practical and mass-producible. The RGB independent deposition method forms patterns according to each color by using the FMM. Also, the RGB independent deposition method uses micro-cavity technology for forming a semi-transmission mirror and a total reflective mirror so as to increase color characteristics. The micro-cavity technology, which is mostly used in a mobile AM-OLED, is a top-emission (TE)-OLED micro-cavity technology involving a high aperture ratio.

FIG. 1 is a diagram schematically illustrating a conventional TE-OLED having a resonance structure. Referring to FIG. 1, R. G, and B light-emitting devices respectively resonate light generated in light-emitting layers. The light-emitting layers are disposed between anodes 102r, 102g, and 102b and cathodes 105r, 105g, and 105b, on a substrate 101. The anodes 102r, 102g, and 102b and the cathodes 105r, 105g, and 105b each include a reflective layer. The resonated light passes through the cathodes 105r, 105g, and 105b.

Optical distances Lr, Lg, and Lb are respectively between the anodes 102r, 102g, and 102b, and the cathodes 105r, 105g, and 105b in each R. G, and B pixel. The optical distances Lr, Lg, and Lb are adjusted according to a thickness of the cathodes 105r, 105g, and 105b or a thickness of an organic layer. Light emitted outside the conventional TE-OLED according to resonance has a smaller full width at half maximum (FWHM), has an increased intensity at a peak wavelength, and a higher color gamut than before it is resonated. However, in order for the resonance structure to maintain color characteristics, a thickness of a resonator must be maintained within a process margin of 1%. Accordingly, an OLED needs to be developed which has excellent color characteristics and an excellent process margin.

SUMMARY

Aspects of the present invention provide a blue light-emitting device having a non-resonant structure using a reflective electrode and a transmission electrode, and having excellent color characteristics, and an organic light-emitting display including the blue light-emitting device.

According to an aspect of the present invention, there is provided a blue light-emitting device including: a transparent electrode; a reflective electrode facing the transparent electrode; and an intermediate layer disposed between the transparent electrode and the reflective electrode, including a blue light-emitting layer, and dissipating light reflected at the reflective electrode by adjusting a distance between the reflective electrode and a light-emitting zone of the blue light-emitting layer.

According to an aspect of the invention, the intermediate layer may further include: a first functional layer disposed between the transparent electrode and the blue light-emitting layer; and a second functional layer disposed between the reflective electrode and the blue light-emitting layer.

According to an aspect of the invention, the distance between the reflective electrode and the light-emitting zone may be determined based on a phase shift value of the light reflected at the reflective electrode, and a wavelength of the dissipated light.

According to an aspect of the invention, the distance between the reflective electrode and the light-emitting zone may correspond to a thickness of the second functional layer, when the light-emitting zone is formed on an interface between the second functional layer and the blue light-emitting layer.

According to an aspect of the invention, the distance between the reflective electrode and the light-emitting zone may correspond to a sum of a thickness of the second functional layer and a thickness of the blue light-emitting layer, when the light-emitting zone is formed on an interface between the first functional layer and the blue light-emitting layer.

According to an aspect of the invention, the transparent electrode may be an anode.

According to an aspect of the invention, the transparent electrode may be a cathode.

According to an aspect of the invention, a wavelength of the dissipated light may be close to a light emission wavelength peak of the blue light-emitting layer.

According to an aspect of the invention, the blue light-emitting device may be a top-emission light-emitting device or a bottom-emission light-emitting device.

According to another aspect of the present invention, there is provided an organic light-emitting display including: a transparent substrate; and a blue light-emitting device comprising a transparent electrode disposed on the transparent substrate, a reflective electrode facing the transparent electrode, and an intermediate layer disposed between the transparent electrode and the reflective electrode and including a blue light-emitting layer so that light of the blue light-emitting layer is emitted in a direction toward the transparent substrate, wherein light reflected at the reflective electrode is dissipated by adjusting a distance between the reflective electrode and a light-emitting zone of the blue light-emitting layer.

According to another aspect of the present invention, there is provided an organic light-emitting display including: a transparent substrate; and a blue light-emitting device comprising a reflective electrode disposed on the transparent substrate, a transparent electrode facing the reflective electrode, and an intermediate layer disposed between the transparent electrode and the reflective electrode and including a blue light-emitting layer so that light of the blue light-emitting layer is emitted in a direction toward the transparent electrode, wherein light reflected at the reflective electrode is dissipated by adjusting a distance between the reflective electrode and a light-emitting zone of the blue light-emitting layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
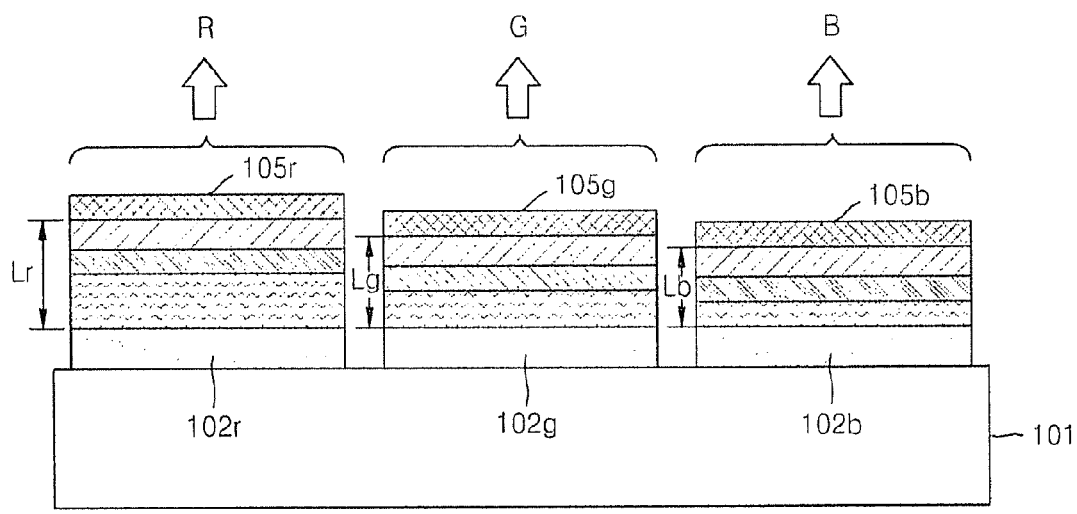
FIG. 1 is a diagram schematically illustrating a conventional top-emission organic light-emitting display (TE-OLED) having a resonance structure.

Reference will now be made in detail to the present embodiments of the present invention, examples of which are illustrated in the accompanying drawings, wherein like reference numerals refer to the like elements throughout. The embodiments are described below in order to explain the present invention by referring to the figures. When a part "includes" an element, the part may include another element unless otherwise described.

When a large display, such as a TV, is to be mass-produced, it is difficult to use a resonance structure having a small process margin. However, a non-resonance structure can be used in large TVs, since the non-resonance structure has a large process margin. However, in a current non-resonance structure, color characteristics in a sRGB [R (0.64, 0.33), G (0.3, 0.6), B (0.15, 0.06)] required for large TVs are obtained in red and green light-emitting structures, but are not obtained in a blue light-emitting structure. Accordingly, aspects of the present invention provide a display including a non-resonance blue light-emitting device having high color characteristics and a method of manufacturing the non-resonance blue light-emitting device.

Figure 2:
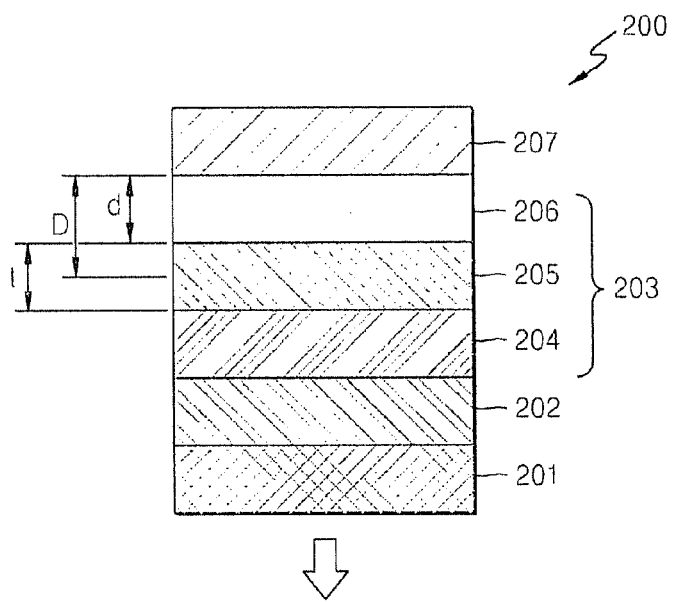
FIG. 2 is a diagram schematically illustrating an OLED including a non-resonance blue light-emitting device, according to an embodiment of the present invention.

FIG. 2 is a diagram schematically illustrating an organic light-emitting display (OLED) including a non-resonance blue light-emitting device 200, according to an embodiment of the present invention. Referring to FIG. 2, the OLED includes a substrate 201, and the non-resonance blue light-emitting device 200 disposed on the substrate 201. The non-resonance blue light-emitting device 200 includes a transparent electrode 202, an intermediate layer 203 including a blue light-emitting layer 205, and a reflective electrode 207. Also, a sealing member (not shown) for sealing the transparent electrode 202, the intermediate layer 203, and the reflective electrode 207 may be disposed on the reflective electrode 207. For convenience of description, descriptions about red and green light-emitting devices and the sealing member will be omitted herein in the description of embodiments of the present invention.

The non-resonance blue light-emitting device 200 is disposed on the substrate 201. The substrate 201 may be formed of transparent glass including silicon oxide ($SiO_2$) as a main component. Although not illustrated in FIG. 2, a buffer layer may be disposed on the substrate 201 so as to planarize the substrate 201 and to block impure elements from penetrating into the substrate 201. The buffer layer may be formed of $SiO_2$ and/or silicon nitride (SiNx). However, a material for forming the substrate 201 is not limited to transparent glass, and the substrate 201 may be formed of transparent plastic or metal.

The transparent electrode 202 is disposed on the substrate 201 for each pixel in the OLED. The transparent electrode 202 may be formed of transparent conductive material such as indium tin oxide (ITO), indium zinc oxide (IZO), zinc oxide (ZnO), or indium oxide ($In_2O_3$), and may be formed by patterning using a photolithography method. A thin-film transistor (TFT) layer (not shown) including at least one TFT is further disposed between the transparent electrode 202 and the substrate 201. The transparent electrode 202 may be electrically connected to the TFT layer. The transparent electrode 202 may operate as an anode by being connected to an external electrode terminal (not shown).

The reflective electrode 207 is disposed on the intermediate layer 203 corresponding to the transparent electrode 202. The reflective electrode 207 may be formed by depositing a reflective conductive material, such as lithium (Li), calcium (Ca), an alloy of lithium fluoride (LiF) and Ca, an alloy of LiF and aluminum (Al), Al, silver (Ag), magnesium (Mg), barium (Ba), or a compound thereof, on the entire surface of the intermediate layer 203. The reflective electrode 207 may operate as a cathode by being connected to an external electrode terminal (not shown).

The polarities of the transparent electrode 202 and the reflective electrode 207 may be interchanged.

The intermediate layer 203 is disposed between the transparent electrode 202 and the reflective electrode 207 and includes the blue light-emitting layer 205. A LED may be classified into an OLED or an inorganic LED based on a type of the intermediate layer 203. The blue light-emitting layer 205 emits blue light according to an electrical operation of the transparent electrode 202 and the reflective electrode 207.

While not required in all aspects, the shown intermediate layer 203 further includes a functional layer 204 including a hole transport layer (HTL) and a hole injection layer (HIL) below the blue light-emitting layer 205, and a functional layer 206 including an electron transport layer (ETL) and an electron injection layer (EIL) above the blue light-emitting layer 205. Alternatively, when the transparent electrode 202 is a cathode, the intermediate layer 203 may include the functional layer 204 including an ETL and an EIL below the blue light-emitting layer 205, and the functional layer 206 including an HTL and an HIL on the blue light-emitting layer 205. Here, the functional layers 204 and 206 may include the HIL, the HTL, the ETL, and the EIL in different structures, besides the ones above.

In the OLED, the intermediate layer 203 may be formed of a low molecular weight organic material, such as copper phthalocyanine (CuPc), N,N'-di(naphthalene-1-yl)-N,N'-diphenyl-benzidine (NPB), tris-8-hydroxyquinoline aluminum (Alq3), or the like. The intermediate layer 203 formed of the low molecular weight organic material may be formed by depositing the low molecular weight organic material in a vacuum state. At this time, the blue light-emitting layer 205 may be formed by depositing a mask having a slit in a predetermined pattern according to each pixel. However, a structure of the intermediate layer 203 is not limited thereto, and the intermediate layer 203 may include different layers as necessary. The intermediate layer 203 may be formed of a polymer organic material such as poly-(2,4)-ethylene-dihydroxy thiophene (PEDOT), polyaniline (PANI), or the like, by using an inkjet printing method or a spin coating method. Non-limiting examples of the blue light-emitting layer 205 may include poly(p-phenylene vinylene) (PPV), soluble PPV, cyano-PPV, polyfluorene, or the like.

When unnecessary light from among light generated and spread from the blue light-emitting layer 205 is emitted outside the OLED, it is difficult to obtain color characteristics. Accordingly, the color characteristics of the OLED are increased by blocking the unnecessary light from being emitted outside the OLED. According to the shown embodiment of the present invention, the unnecessary light is blocked by adjusting a distance D between the reflective electrode 207 and a light-emitting zone of the blue light-emitting layer 205. The light-emitting zone of the blue light-emitting layer 205 is a point where exciton distribution is a maximum, and may be generated in an interface between the blue light-emitting layer 205 and the functional layer 206 or between the blue light-emitting layer 205 and the functional layer 204, based on materials used to form the blue light-emitting layer 205 and the functional layers 204 and 206. Also, the light-emitting zone may be generated in the center of the blue light-emitting layer 205 as shown, but the location can vary. The distance D is shown to be between the center of the blue light-emitting layer 205 and the reflective electrode 207 for convenience, but that the distance D is from the reflective electrode 207 to the actual light-emitting zone and will not necessarily always be the center as shown.

The light emitted from the blue light-emitting layer 205 to the reflective electrode 207 is reflected at the reflective electrode 207 according to electrical operation of the transparent electrode 202 and the reflective electrode 207. The light reflected at the reflective electrode 207 is dissipated by adjusting the distance D between the reflective electrode 207 and the light-emitting zone.

The distance D is determined based on a destructive interference wavelength where the light reflected at the reflective electrode 207 and light emitted to the substrate 201 interfere with each other and dissipate. Here, as the destructive interference wavelength is close to a light emission wavelength peak of the blue light-emitting layer 205 (i.e. as the FWHM of a spectrum decreases), the color characteristics of the OLED are increased.

The distance D that satisfies a condition of dissipating the light reflected at the reflective electrode 207 through interference may be obtained according to Equations 1 through 3 below.

Hereinafter, a case when light emitted from the blue light-emitting layer 205 is reflected at an interface between the reflective electrode 207 and the functional layer 206 according to the electrical operation of the transparent electrode 202 and the reflective electrode 207 will be described. Here, the light-emitting zone is formed in an interface between the blue light-emitting layer 205 and the functional layer 206, and the distance D is a thickness d of the functional layer 206. A phase shift value δ generated when the light emitted from the blue light-emitting layer 205 reflects at the reflective electrode 207 is calculated with Equation 1 below.

$$\delta = \arctan\left\{2 \cdot \frac{(n_s k_m - n_m k_s)}{(n_s^2 - n_m^2 + k_s^2 - k_m^2)}\right\}$$ Equation 1

$n_s$ and $k_s$ denote complex refractive indices of the functional layer 206. $n_m$ and $k_m$ denote complex refractive indices of the reflective electrode 207. When the functional layer 206 has a multi-layered structure, $n_s$ and $k_s$ denote complex refractive indices of a layer of the functional layer 206, which contacts the reflective electrode 207.

A condition of dissipating light emitted forward to the substrate 201 from the blue light-emitting layer 205 and light emitted backward to the reflective electrode 207 and then reflected at the reflective electrode 207, as the lights interfere, is defined by Equation 2 below.

$$\pi \cdot q = \frac{2\pi(2\sum n_{j\lambda} d_j)}{\lambda} + \delta$$ Equation 2

When the functional layer 206 has a multi-layered structure, $d_j$ denotes a thickness of a j-th layer in the functional layer 206, $n_{j\lambda}$ denotes a refraction index of the j-th layer in a wavelength λ, and q is a positive odd number such as 1, 3, 5, 7, or the like.

Equation 3 is obtained from Equations 1 and 2.

$$\lambda = \frac{2\pi(2\sum n_{j\lambda} d_j)}{(\pi \cdot q - \delta_\lambda)}$$ Equation 3

According to Equation 3, the thickness d of the functional layer 206 may be calculated according to $\Sigma d_j$ in the wavelength λ where the lights interfere with each other and dissipate. The thickness d may be maintained to be at least 1000 Å, and preferably, at least 2000 Å. When the light-emitting zone is formed in an interface between the functional layer 204 and the blue light-emitting layer 205, the distance D may be a value d+t obtained by adding the thickness d of the functional layer 206 and a thickness t of the blue light-emitting layer 205. The value d+t may be maintained to be at least 1000 Å, and preferably, at least 2000 Å. An upper limit of the value d+t may be 3500 Å, but the upper limit is not limit thereto and is generally determined according to a deposition time of the layer and a voltage drop due to the thickness d. The distance D may be determined based on the entire thickness of the non-resonance blue light-emitting device 200, and the entire thickness of red and green light-emitting devices. The same principle for satisfying the destructive interference condition applies even when the light-emitting zone is formed at the center of the blue light-emitting layer 205 or at an area where the exciton distribution is a maximum in the blue light-emitting layer 205.

Figure 3:
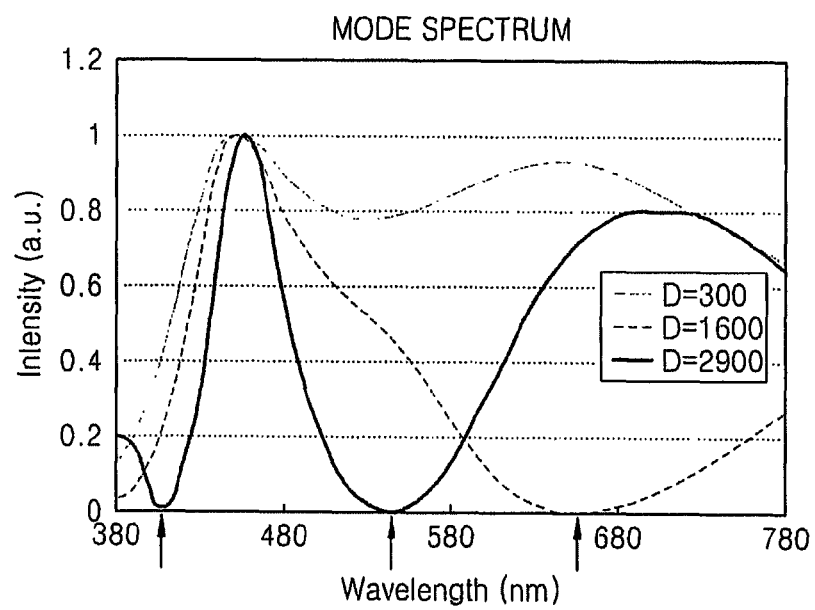
FIG. 3 is a mode spectrum according to a distance between a light-emitting zone and a reflective electrode in the non-resonance blue light-emitting device of FIG. 2, according to an embodiment of the present invention.

FIG. 3 is a mode spectrum according to the distance D between the light-emitting zone and the reflective electrode 207 in the non-resonance blue light-emitting device 200 of FIG. 2, according to an embodiment of the present invention.

The mode spectrum is a spectrum of light exiting at a 90 degree angle with respect to the substrate, when a point source having a white spectrum intensity of 1 in a visible light domain is disposed at the blue light-emitting layer 205. At wavelengths indicated by arrows in FIG. 3, light is impossible to be extracted due to destructive interference. Referring to FIG. 3, when the distance D (i.e., the light-emitting zone, and the reflective electrode 207) is at least a predetermined value, a destructive interference wavelength occurs on a right of a blue light wavelength (about 470 nm). As the distance D increases, the destructive interference wavelength occurs on right and left of the blue light wavelength. Specifically, when the distance D is 300 Å, a destructive interference wavelength does not occur. When the distance D is 1600 Å, the destructive interference wavelength occurs near 650 nm. When the distance D is 2900 Å, the destructive interference wavelengths occur near 410 nm and 540 nm. Accordingly, since a spectrum domain that deteriorates color characteristics is not extracted, deep blue color characteristics are increased. In other words, the color characteristics are excellent when the distance D is at least 1000 Å, and are even better when the distance D is at least 2000 Å.

Figure 4:
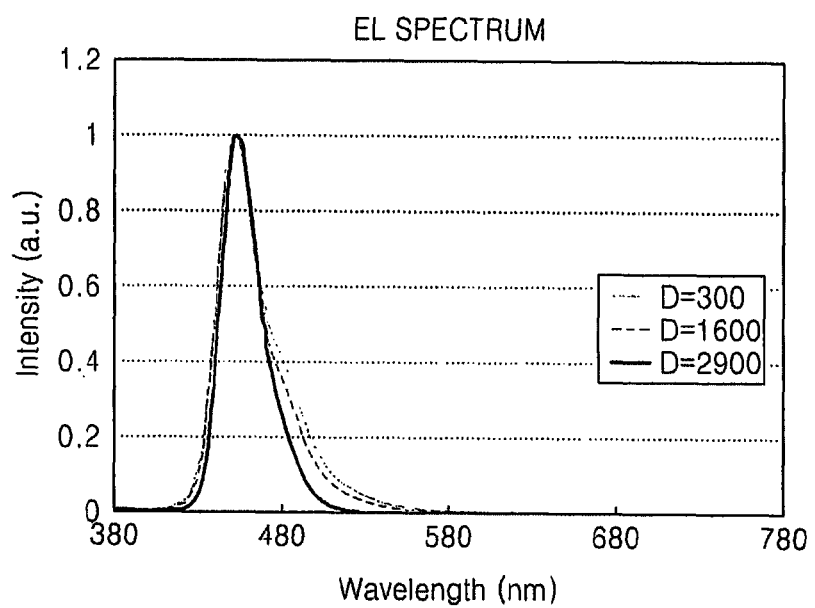
FIG. 4 is an electroluminescence (EL) spectrum according to the distance between the light-emitting zone and the reflective electrode in the non-resonance blue light-emitting device of FIG. 2, according to an embodiment of the present invention.

FIG. 4 is an electroluminescence (EL) spectrum according to the distance D between the light-emitting zone and the reflective electrode 207 in the non-resonance blue light-emitting device 200 of FIG. 2, according to an embodiment of the present invention. The transparent electrode 202 is disposed on the substrate 201, and the intermediate layer 203 is disposed on the transparent electrode 202. The intermediate layer 203 may have a multi-layered structure including the blue light-emitting layer 205 and the functional layers 204 and 206 for improving light-emitting efficiency of the blue light-emitting layer 205 as shown, although other arrangements are possible.

The blue light-emitting layer 205 may be formed of a fluorescent material, a phosphoric material, a low molecular weight material, a polymer material, a single material, or a composition of host and guest materials. The functional layers 204 and 206 may include at least one of ETL and HTL for adjusting a balance between electrons and holes, and EIL and HIL for strengthening the injection of the electrons and holes. In FIG. 4, the thickness d of the functional layer 206 disposed between the reflective layer 207 and the blue light-emitting layer 205 is differently formed, such as 300 Å, 1600 Å, and 2900 Å.

The reflective electrode 207 is formed on the intermediate layer 203. The reflective electrode 207 may be formed of a reflective conductive material such as Al, Ca, Ba, Ag, Mg, or a combination thereof.

Referring to FIG. 4, as the thickness d of the functional layer 206 increases, a width of the EL spectrum decreases as a destructive interference wavelength is near a blue light wavelength (about 470 nm). A CIE 1931 color coordinate according to each thickness d of the functional layer 206 is as shown in Table 1. Referring to Table 1, as the thickness increases, values of Cx and Cy are close to blue color characteristics, and when the thickness is 2900 Å, the OLED shows sRGB blue color characteristics (0.15, 0.06) or above.

TABLE 1

|  | Cx | Cy |
| --- | --- | --- |
| d = 300 Å | 0.144 | 0.077 |
| d = 1600 Å | 0.142 | 0.065 |
| d = 2900 Å | 0.145 | 0.041 |

Figure 5:
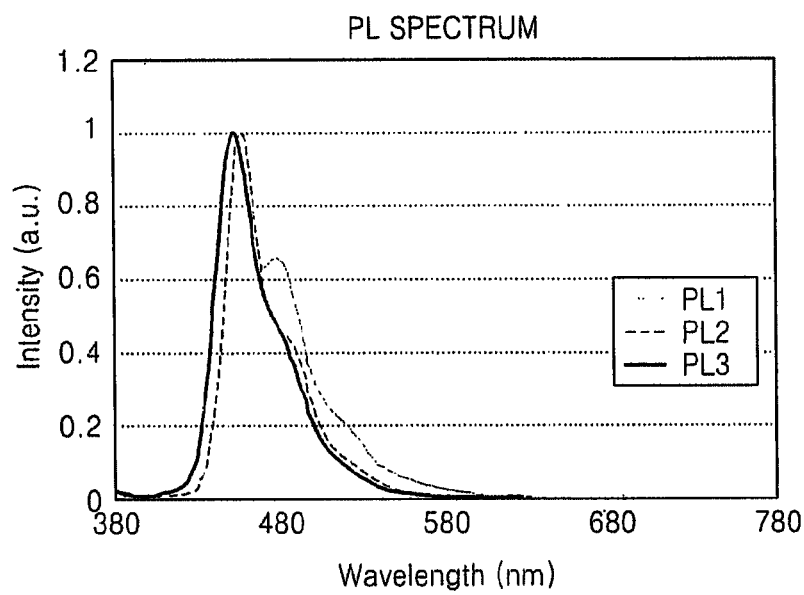
FIG. 5 is a photoluminescence (PL) spectrum of three different blue light-emitting layers used in the non-resonance blue light-emitting device of FIG. 2, according to an embodiment of the present invention.

FIG. 5 is a photoluminescence (PL) spectrum of three different blue light-emitting layers 205 used in the non-resonance blue light-emitting device 200 of FIG. 2, according to an embodiment of the present invention. In FIG. 5, the substrate 201, the transparent electrode 202, and the blue light-emitting layer 205 having a thickness of 300 Å are sequentially formed in the stated order, wherein different materials are used to form the blue light-emitting layer 205.

Referring to FIG. 5, color characteristics of light emitted from the three different blue light-emitting layers 205 are not good. In particular, a plot PL1 shows the most change in a color. CIE 1931 color coordinates of plots PL1 through PL3 of the blue light-emitting layers 205 are as shown in Table 2.

TABLE 2

|  | Cx | Cy |
| --- | --- | --- |
| PL1 | 0.147 | 0.138 |
| PL2 | 0.139 | 0.111 |
| PL3 | 0.143 | 0.086 |

Figure 6:
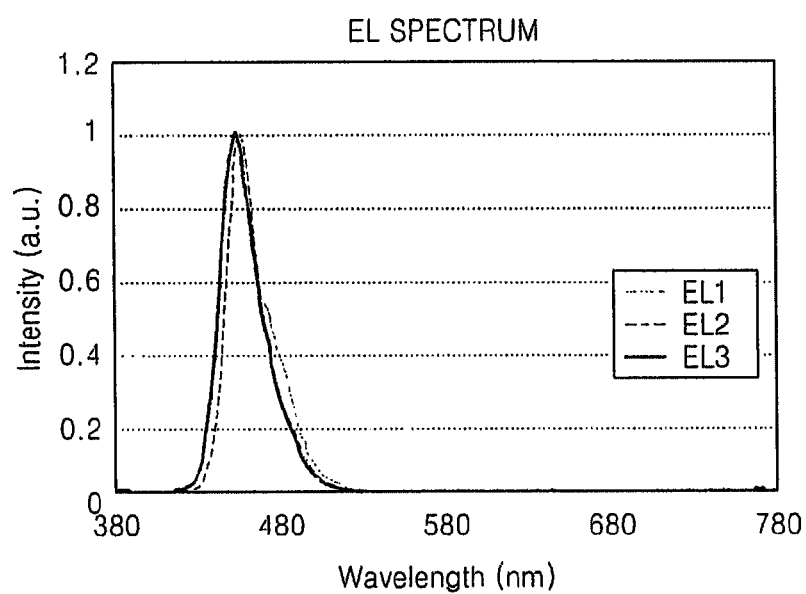
FIG. 6 is an EL spectrum when the three different blue light-emitting layers of FIG. 5 are used in the non-resonance blue light-emitting device of FIG. 2, according to an embodiment of the present invention.

FIG. 6 is an EL spectrum when the three different blue light-emitting layers 205 of FIG. 5 are used in the non-resonance blue light-emitting device 200 of FIG. 2, according to an embodiment of the present invention. In the shown embodiment of the present invention, the substrate 201, the transparent electrode 202, the functional layers 204 and 206, the blue light-emitting layer 205, and the reflective electrodes 207 are stacked as described with reference to FIG. 4, wherein the three different blue light-emitting layers 205 of FIG. 5 are used. Here, the distances D between the reflective electrode 207 and the light-emitting zones of the three different blue light-emitting layers 205 are all 2900 Å.

Referring to FIG. 6, when the distances D are 2900 Å, plots EL1 through EL3 of the lights emitted from the three different blue light-emitting layers 205 are narrower than plots PL1 through PL3 of FIG. 5 by a full width at half maximum (FWHM). Thus, clear colors may be realized. CIE 1931 color coordinates of the plots EL1 through EL3 are as shown in Table 3 below.

TABLE 3

|  | Cx | Cy |
| --- | --- | --- |
| EL1 | 0.144 | 0.052 |
| EL2 | 0.141 | 0.048 |
| EL3 | 0.145 | 0.041 |

Referring to Table 3, blue color characteristics of the light emitted from the blue light-emitting layer 205 are close to sRGB blue color characteristics (0.15, 0.06) in the non-resonance structure of the present embodiment, regardless of a material used to form the blue light-emitting layer 205. With regard to Tables 2 and 3 and without limitation thereto, the blue light-emitting layer 205 of PL1/EL1 comprises a host of ADN(9,10-Di(naphth-2-yl)anthracene and a dopant of GBD 34 (Gracel Company), the blue light-emitting layer 205 of PL2/EL2 comprises a host of ADN(9,10-Di(naphth-2-yl)anthracene and a dopant of NUBD 369 (SFC Company), and the blue light-emitting layer 205 of PL3/EL3 comprises a host of ADN(9,10-Di(naphth-2-yl)anthracene and a dopant of NUBD 005 (SFC Company). As such, the blue light-emitting layer 205 and thus can include multiple materials, such as the poly(p-phenylene vinylene) (PPV), soluble PPV, cyano-PPV, polyfluorene, without appreciably affecting the blue color characteristics.

Figure 7:
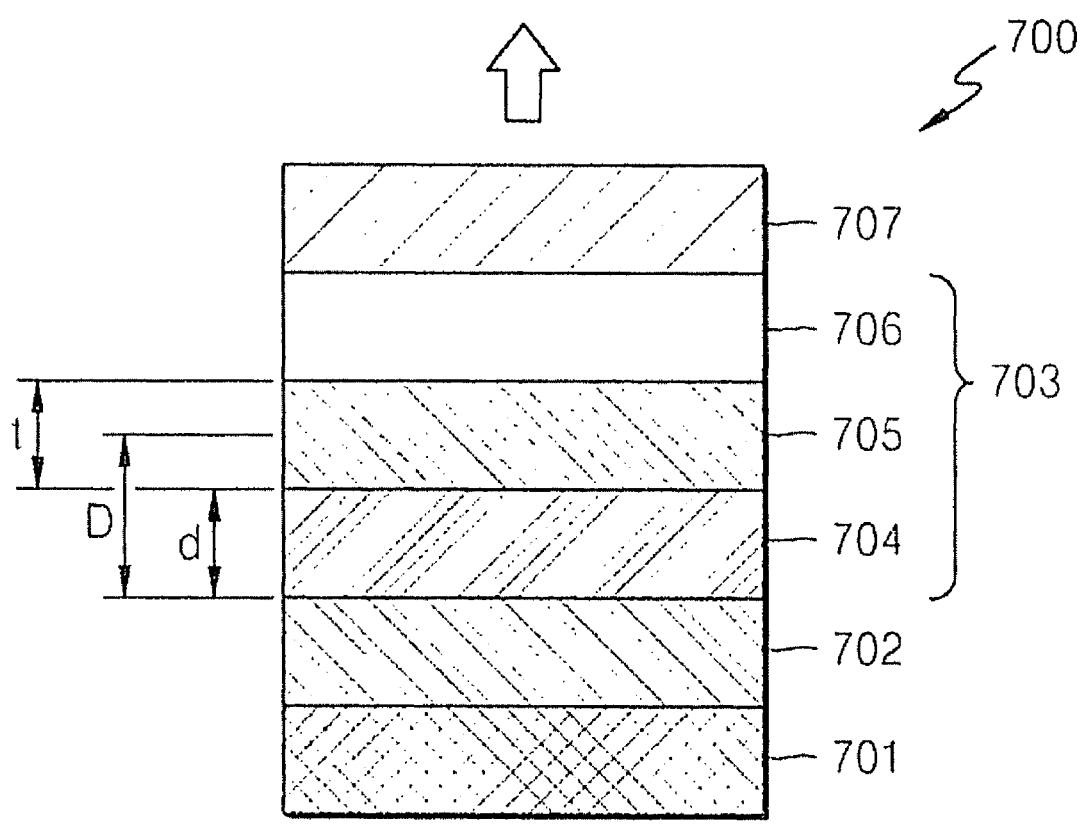
FIG. 7 is a diagram schematically illustrating an OLED including a non-resonance blue light-emitting device, according to an embodiment of the present invention.

FIG. 7 is a diagram schematically illustrating an OLED including a non-resonance blue light-emitting device 700, according to an embodiment of the present invention. Referring to FIG. 7, the non-resonance blue light-emitting device 700 is a top-emission type blue light-emitting device. The non-resonance blue light-emitting device 700 is formed by sequentially stacking a substrate 701, a reflective electrode 702, an intermediate layer 703 including a blue light-emitting layer 705, and a transparent electrode 707 in the order stated. The intermediate layer 703 further includes a functional layer 704 below the blue light-emitting layer 705 and a functional layer 706 above the blue light-emitting layer 705. The non-resonance blue light-emitting device 700 is different from the non-resonance blue light-emitting device 200 of FIG. 2, as light emitted from the blue light-emitting layer 705 is emitted upward through the transparent electrode 707, but the principle of increasing color characteristics are substantially the same in the non-resonance blue light-emitting devices 200 and 700, and thus details thereof will not be repeated.

A distance D between the reflective electrode 702 and a light-emitting zone of the blue light-emitting layer 705, for dissipating light emitted from the blue light-emitting layer 705 and reflected at the reflective electrode 702, satisfies the above-described destructive interference condition. A wavelength dissipated due to destructive interference has a narrow FWHM near a blue light emission wavelength peak, and thus color characteristics may be increased.

When the light-emitting zone is formed on an interface between the blue light-emitting layer 705 and the functional layer 704, a thickness d of the functional layer 704 is determined based on a wavelength at which destructive interference occurs. The thickness d may be maintained to be at least 1000 Å, preferably, at least 2000 Å. Alternatively, when the light-emitting zone is formed on an interface between the functional layer 706 and the blue light-emitting layer 705, the distance D is a value d+t obtained by adding the thickness d of the functional layer 704 and a thickness t of the blue light-emitting layer 705, wherein the value d+t is maintained to be at least 1000 Å, preferably, at least 2000 Å. Here, the distance D may be determined considering the entire thickness of the non-resonance blue light-emitting device 700, and the entire thicknesses of the red and green light-emitting devices. The same principle for satisfying the destructive interference condition applies even when the light-emitting zone is at the center of the blue light-emitting layer 705 or at another area where the exciton distribution is a maximum in the blue-light emitting layer 705.

The non-resonance blue light-emitting device 200 or 700 can not only used for an OLED or an inorganic LED, but also for other flat panel display devices using a liquid crystal display (LCD) or an electron emitting device such as a LED.

According to an aspect of the present invention, a blue light-emitting device has a non-resonance structure, wherein a blue light-emitting layer is disposed between a reflective electrode and a transparent electrode, and thus has an excellent process margin.

According to an aspect of the invention, light unnecessarily emitted outside the OLED is dissipated by adjusting a distance between the reflective electrode and the blue light-emitting layer, in detail, between the reflective electrode and a light-emitting zone, thereby obtaining excellent luminance characteristics and high color reproducibility satisfying an sRGB blue standard, even in a wide optical viewing angle.

In addition, a mask for forming a pixel electrode on a backplane of a TFT is not required, a manufacturing yield is excellent since a semi-transmission electrode is not required, and manufacturing time may be reduced, according to an aspect of the invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A blue light-emitting device comprising:
    a transparent electrode;
    a reflective electrode facing the transparent electrode; and
    an intermediate layer disposed between the transparent electrode and the reflective electrode, the intermediate layer comprising a blue light-emitting layer having a light-emitting zone from which light is emitted toward the reflective electrode, wherein a distance between the reflective electrode and the light-emitting zone of the blue light-emitting layer is such that light reflected at the reflective electrode having a wavelength close to a light emission wavelength peak of the blue light-emitting layer is dissipated.

2. The blue light-emitting device of claim 1, wherein the intermediate layer further comprises:
    a first functional layer disposed between the transparent electrode and the blue light-emitting layer; and
    a second functional layer disposed between the reflective electrode and the blue light-emitting layer.

3. The blue light-emitting device of claim 2, wherein the distance between the reflective electrode and the light-emitting zone corresponds to a thickness of the second functional layer, when the light-emitting zone is formed on an interface between the second functional layer and the blue light-emitting layer.

4. The blue light-emitting device of claim 2, wherein the distance between the reflective electrode and the light-emitting zone corresponds to a sum of a thickness of the second functional layer and a thickness of the blue light-emitting layer, when the light-emitting zone is formed on an interface between the first functional layer and the blue light-emitting layer.

5. The blue light-emitting device of claim 1, wherein the distance between the reflective electrode and the light-emitting zone is determined based on a phase shift value of the light reflected at the reflective electrode, and a wavelength of the dissipated light.

6. The blue light-emitting device of claim 1, wherein the transparent electrode is an anode.

7. The blue light-emitting device of claim 1, wherein the transparent electrode is a cathode.

8. The blue light-emitting device of claim 1, wherein the distance between the reflective electrode and the light-emitting zone of the blue light-emitting layer is controlled to be at least 1000 Å.

9. The blue light-emitting device of claim 8, wherein the distance is controlled to be at least 2000 Å.

10. The blue light-emitting device of claim 9, wherein the distance is controlled to be at least 2900 Å.

11. The blue light-emitting device of claim 9, further comprising a multi-layer extending between the reflective electrode and the blue light-emitting layer, wherein the distance is controlled to be at least $\Sigma d_j$, and $\Sigma d_j$ is calculated according to the following equation:

$$\lambda = \frac{2\pi(2\sum n_{j\lambda} d_j)}{(\pi \cdot q - \delta_\lambda)},$$

$d_j$ denotes a thickness of a j-th layer in the multi-layer,
$n_{j\lambda}$ denotes a refraction index of the j-th layer in a wavelength $\lambda$, and
$\delta_\lambda$ is a phase shift value in the wavelength $\lambda$,
q is a positive odd number, and
$\lambda$ is a wavelength of the light emitted from the light-emitting zone.

12. An organic light-emitting display comprising:
a transparent substrate; and
a blue light-emitting device comprising a transparent electrode disposed on the transparent substrate, a reflective electrode facing the transparent electrode, and an intermediate layer disposed between the transparent electrode and the reflective electrode and comprising a blue light-emitting layer which emits light from a light-emitting zone towards the transparent substrate,
wherein a distance between the reflective electrode and the light-emitting zone of the blue light-emitting layer is such that light reflected at the reflective electrode toward the transparent substrate having a wavelength close to a light emission wavelength peak of the blue light-emitting layer is dissipated.

13. The organic light-emitting display of claim 12, wherein the intermediate layer further comprises:
a first functional layer disposed between the transparent electrode and the blue light-emitting layer; and
a second functional layer disposed between the reflective electrode and the blue light-emitting layer.

14. The organic light-emitting display of claim 13, wherein the distance between the reflective electrode and the light-emitting zone corresponds to a thickness of the second functional layer, when the light-emitting zone is formed on an interface between the second functional layer and the blue light-emitting layer.

15. The organic light-emitting display of claim 13, wherein the distance between the reflective electrode and the light-emitting zone corresponds to a sum of a thickness of the second functional layer and a thickness of the blue light-emitting layer, when the light-emitting zone is formed on an interface between the first functional layer and the blue light-emitting layer.

16. An organic light-emitting display comprising:
a transparent substrate; and
a blue light-emitting device comprising a reflective electrode disposed on the transparent substrate, a transparent electrode facing the reflective electrode, and an intermediate layer disposed between the transparent electrode and the reflective electrode and comprising a blue light-emitting layer having a light-emitting zone which emits a light towards the transparent electrode,
wherein a distance between the reflective electrode and the light-emitting zone of the blue light-emitting layer is such that light reflected at the reflective electrode having a wavelength close to a light emission wavelength peak of the blue light-emitting layer is dissipated.

17. The organic light-emitting display of claim 16, wherein the intermediate layer further comprises:
a first functional layer disposed between the transparent electrode and the blue light-emitting layer; and
a second functional layer disposed between the reflective electrode and the blue light-emitting layer.

18. The organic light-emitting display of claim 17, wherein the distance between the reflective electrode and the light-emitting zone corresponds to a thickness of the second functional layer, when the light-emitting zone is formed on an interface between the second functional layer and the blue light-emitting layer.

19. The organic light-emitting display of claim 17, wherein the distance between the reflective electrode and the light-emitting zone corresponds to a sum of a thickness of the second functional layer and a thickness of the blue light-emitting layer, when the light-emitting zone is formed on an interface between the first functional layer and the blue light-emitting layer.

20. A flat panel display comprising:
a transparent substrate; and
a blue light-emitting device disposed on the transparent substrate, the blue light-emitting device comprising a reflective electrode, a transparent electrode, and an intermediate layer disposed between the transparent electrode and the reflective electrode and comprising a blue light-emitting layer having a light-emitting zone which emits a light received at the transparent electrode,
wherein a distance between the reflective electrode and the light-emitting zone of the blue light-emitting layer is such that light reflected at the reflective electrode having a wavelength close to a light emission wavelength peak of the blue light-emitting layer is dissipated.

21. The flat panel display of claim 20, wherein the distance between the reflective electrode and the light-emitting zone of the blue light-emitting layer is controlled to be at least 1000 Å.

22. The flat panel display of claim 21, wherein the distance is controlled to be at least 2000 Å.

23. The flat panel display of claim 22, wherein the distance is controlled to be at least 2900 Å.

24. The flat panel display of claim 20, further comprising a functional layer extending between the reflective electrode and the blue light-emitting layer, wherein the distance is at least a thickness of the functional layer and is less than a sum of a combined thickness of the blue light-emitting layer and the functional layer.

25. The flat panel display of claim 24, wherein the distance is at least 1000 Å.

26. The flat panel display of claim 20, further comprising a multi-layer extending between the reflective electrode and the blue light-emitting layer, wherein
the distance is controlled to be least $\Sigma d_j$, and
$\Sigma d_j$ is calculated according to the following equation:

$$\lambda = \frac{2\pi(2\sum n_{j\lambda} d_j)}{(\pi \cdot q - \delta_\lambda)},$$

$d_j$ denotes a thickness of a j-th layer in the multi-layer,
$n_{j\lambda}$ denotes a refraction index of the j-th layer in a wavelength $\lambda$, and
$\delta_\lambda$ is a phase shift value in the wavelength $\lambda$, q is a positive odd number, and
λ is a wavelength of the light emitted from the light-emitting zone.

* * * * *

UNITED STATES PATENT AND TRADEMARK OFFICE
CERTIFICATE OF CORRECTION

PATENT NO.         : 8,536,782 B2                                          Page 1 of 1
APPLICATION NO.    : 12/968463
DATED              : September 17, 2013
INVENTOR(S)        : Sung-Hun Lee et al.

It is certified that error appears in the above-identified patent and that said Letters Patent is hereby corrected as shown below:

In the Claims

Column 12, Claim 26, line 56      After "be"

Insert -- at --

Signed and Sealed this
Twenty-fourth Day of March, 2015

Michelle K. Lee
*Director of the United States Patent and Trademark Office*